United States Patent
Shinya et al.

(10) Patent No.: US 7,050,710 B2
(45) Date of Patent: May 23, 2006

(54) THERMAL TREATMENT EQUIPMENT AND THERMAL TREATMENT METHOD

(75) Inventors: Hiroshi Shinya, Kumamoto (JP); Yasutaka Souma, Kumamoto (JP); Takahiro Kitano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/491,432

(22) PCT Filed: Oct. 22, 2002

(86) PCT No.: PCT/JP02/10968
§ 371 (c)(1),
(2), (4) Date: Apr. 12, 2004

(87) PCT Pub. No.: WO03/036694
PCT Pub. Date: May 1, 2003

(65) Prior Publication Data
US 2004/0245237 A1    Dec. 9, 2004

(30) Foreign Application Priority Data
Oct. 25, 2001  (JP) ............................. 2001-327194

(51) Int. Cl.
*F26B 19/00* (2006.01)
(52) U.S. Cl. .................. 392/418; 392/416; 118/724; 118/725; 118/50.1; 219/390; 219/405; 219/411
(58) Field of Classification Search .......... 219/390, 219/405, 411; 118/724, 725, 50.1; 392/416, 392/418
See application file for complete search history.

(56) References Cited

U.S. PATENT DOCUMENTS

| | | | |
|---|---|---|---|
| 4,958,061 A * | 9/1990 | Wakabayashi et al. ...... 219/411 |
| 5,817,178 A * | 10/1998 | Mita et al. .................. 118/666 |
| 6,190,459 B1 | 2/2001 | Takeshita et al. |
| 6,246,030 B1 | 6/2001 | Matsuyama |
| 6,599,366 B1 | 7/2003 | Kitano et al. |

FOREIGN PATENT DOCUMENTS

| | | |
|---|---|---|
| JP | 8-316138 | 11/1996 |
| JP | 8316138 | * 11/1996 |
| JP | 2001-274051 | 10/2001 |

* cited by examiner

*Primary Examiner*—Shawntina Fuqua
(74) *Attorney, Agent, or Firm*—Oblon, Spivak, McClelland, Maier & Neustadt, P.C.

(57) ABSTRACT

A heat treatment apparatus configured to perform heat treatment on a wafer having a surface on which a coating film is formed, and includes: a holding member for holding the wafer almost horizontally; a chamber for housing the wafer held by the holding member; a hot plate having gas permeability and disposed above the wafer held by the holding member in the chamber so that the coating film formed on the wafer can be directly heated; and an exhaust port provided on the top face of the chamber and exhausting gas in the chamber. Gas generated from the coating film passes through the hot plate and is exhausted from the chamber. Accordingly, uniformity of a coating film is improved. As a result, CD uniformity may be improved, LER characteristics may be improved, and a smooth pattern side face may be obtained.

20 Claims, 10 Drawing Sheets

THERMAL TREATMENT EQUIPMENT AND THERMAL TREATMENT METHOD

TECHNICAL FIELD

The present invention relates to a heat treatment apparatus and a heat treatment method for performing heat treatment on a substrate such as a semiconductor wafer on which a coating film such as a resist film is formed.

BACKGROUND ART

In a process of fabricating a semiconductor device, by using so-called photolithography technique, a predetermined circuit pattern is formed on the surface of a semiconductor wafer. In the photolithography process, for example, a series of processes of applying a photoresist solution on a semiconductor wafer subjected to a cleaning process to thereby form a resist film, exposing the resist film in a predetermined pattern, and developing the exposed resist film are performed.

A resist film is formed by, for example, the following process. First, a semiconductor wafer is fixed to a spin chuck. Next, for example, by using a resist solution discharge nozzle having, at its end, a tube member in which the diameter of a path of the resist solution is constant, a predetermined amount of the resist solution is applied to the surface of the wafer. By rotating the spin chuck in such a state, the resist solution is spread to the entire wafer and the thickness is adjusted to a predetermined thickness. After that, the wafer is subjected to predetermined heat treatment, to be specific, a pre-baking process.

Figure 10:
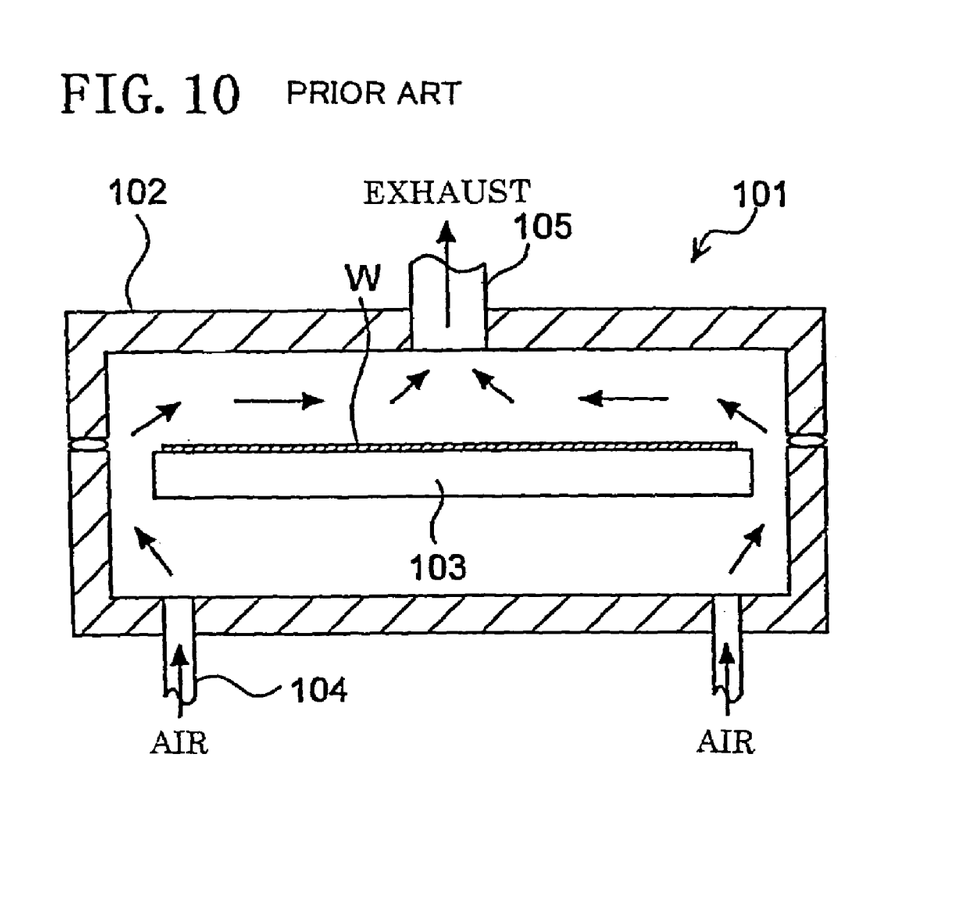
FIG. 10 is a sectional view showing a schematic structure of a conventional pre-bake unit.

Conventionally, the resist film pre-baking process is performed by using a heating unit 101 shown in FIG. 10. Heating unit 101 has a chamber 102, a hot plate 103 provided in chamber 102, an air inlet 104 for introducing a predetermined amount of air into chamber 102, and an exhaust port 105 for exhausting a predetermined amount of air in chamber 102. In such heating unit 101, a wafer is placed on hot plate 103 held at a predetermined temperature and is heated. Concurrently with the operation, while introducing a predetermined amount of air into chamber 102 from air inlet 104 and exhausting the same amount of air from exhaust port 105, a resist film pre-baking process is performed.

In recent years, in the photolithography process, as a pattern is becoming finer and thinner, uniformity in a wafer plane of pattern line width (hereinafter, referred to as "CD (Critical Dimension) uniformity") is strictly demanded. A resist material started to appear in which line width fluctuations occur conspicuously due to air current in the heating unit for performing a pre-baking process after application of a resist, that has not been a problem. However, in a conventional heat treatment method performed by using heating unit 101 while allowing air to flow in chamber 102, since it is considered that variations occur in density of polymer included in the resist solution or density of residual solvent due to a change in the surface temperature of the resist film caused by air current, the conventional technique cannot deal with such a problem.

As a pattern is becoming finer and thinner, it is becoming more important to control roughness of a side face of a pattern (hereinafter, referred to as "LER (Line Edge Roughness"). As a method of solving the problem of LER, adjustment of compositions of the resist solution is being attempted. However, a sufficient effect has not been produced in relation to other resist characteristics such as resist sensitivity and CD uniformity. On the other hand, there is no approach from the heating unit side to LER.

DISCLOSURE OF THE INVENTION

An object of the present invention is to provide a heat treatment apparatus and a heat treatment method capable of performing heat treatment which improves CD uniformity. Another object of the present invention is to provide a heat treatment apparatus and a heat treatment method capable of obtaining an excellent LER characteristic.

A heat treatment apparatus of the present invention achieving the object is, in an aspect, a heat treatment apparatus for performing heat treatment on a wafer having a surface on which a coating film is formed, including: a holding member for holding the wafer almost horizontally; a chamber for housing the wafer held by the holding member; a hot plate disposed above the wafer held by the holding member in the chamber so that the coating film formed on the wafer can be directly heated; a gap having a predetermined width provided between an end face of the hot plate and an inner wall face of the chamber; and an exhaust port provided on the top face of the chamber and exhausting gas in the chamber. In the heat treatment apparatus, the gas in the chamber is exhausted from the exhaust port, thereby holding the inside of the chamber in predetermined pressure-reduced atmosphere, and gas generated from the coating film when the coating film is heated by the hot plate passes through the gap and is exhausted to the outside of the chamber.

A heat treatment apparatus of the present invention is, in another aspect, a heat treatment apparatus for performing heat treatment on a wafer having a surface on which a coating film is formed, including: a holding member for holding the wafer almost horizontally; a chamber for housing the wafer held by the holding member; a hot plate having gas permeability and disposed above the wafer held by the holding member in the chamber so that the coating film formed on the wafer can be directly heated; and an exhaust port provided on the top face of the chamber and exhausting gas in the chamber. In the heat treatment apparatus, gas generated from the coating film when the coating film is heated by the hot plate passes through the hot plate and is exhausted to the outside of the chamber.

The heat treatment apparatus of the present invention is, in any of the aspects, suitably used particularly for a process of heating a resist film at the time of applying a resist solution on a wafer to form a resist film.

In the heat treatment apparatus in any of the aspects, there is a case that an air supply pipe for supplying air into the chamber is further provided. This is because there is a case that air has to be supplied to prevent the wafer W from becoming hard to be heated due to excessive pressure reduction in the chamber.

In the case where the coating film is a resist film formed by applying a resist solution on the wafer (W), by making steam of a solvent of the resist at an almost saturated vapor pressure be included in the air supplied from air supply pipe, evaporation of the solvent from the resist film in the pre-bake process is suppressed, and evaporation progresses at lower speed. As a result, uniformity of the quality of the resist film and the like can be further improved.

A heat treatment method of the present invention includes, in an aspect, a first step of forming a resist film by coating a wafer with a resist solution; a second step of holding the wafer on which the resist film is formed in a hermetically closed chamber, and a third step of disposing a hot plate having gas permeability in a predetermined position above the wafer on which the resist film is formed and, while heating the resist film by the hot plate, exhausting gas in the chamber so that gas evaporated from the resist film is exhausted via the hot plate.

A heat treatment method of the present invention includes, in another aspect, a first step of forming a resist film by coating a wafer with a resist solution, a second step of holding the wafer on which the resist film is formed in a hermetically closed chamber, and a third step of disposing a hot plate in a predetermined position above the wafer on which the resist film is formed, while heating the resist film by the hot plate, exhausting gas in the chamber to hold the chamber in a predetermined pressure-reduced atmosphere, and exhausting gas evaporated from the resist film from the chamber.

According to the heat treatment apparatus and the heat treatment method of the present invention as described above, a coating film formed on a wafer can be directly heated from above, and a gas and the like included in the coating film can be evaporated uniformly from the coating film and exhausted. Thus, uniformity in the quality of the coating film is improved and CD uniformity can be improved. By increasing uniformity of the quality of the coating film, LER characteristics are changed to the better, and a smooth pattern side face can be obtained.

BEST MODE FOR CARRYING OUT THE INVENTION

Hereinafter, embodiments of the present invention will be described in detail with reference to the drawings. A resist coating/development processing system having a hot plate unit for pre-baking a semiconductor wafer (hereinafter, referred to as "wafer") on which a resist solution is applied and performing a series of processes from application of a resist to development will be described as an example.

Figure 1:
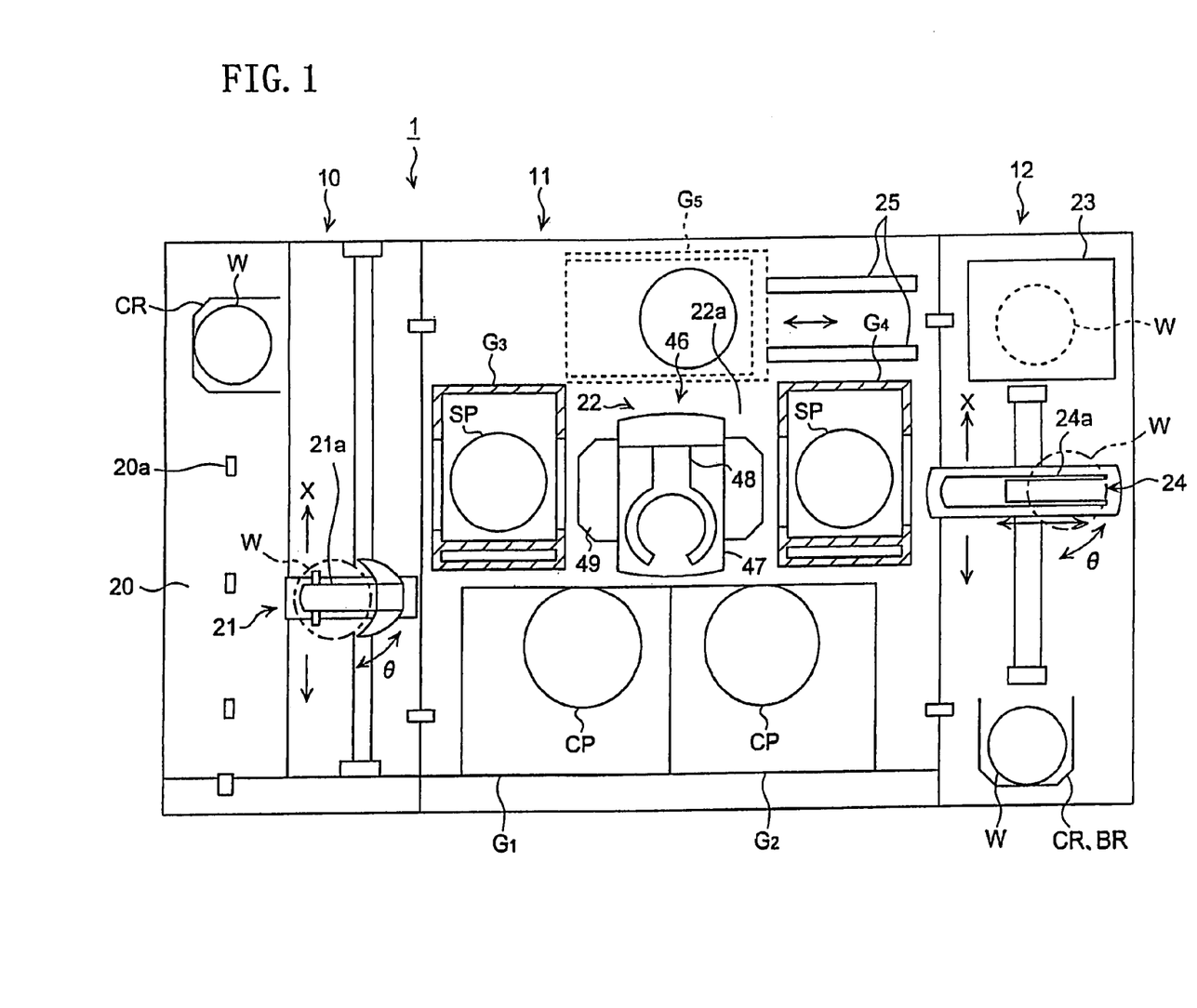
FIG. 1 is a schematic plan view showing a resist coating/development processing system as an embodiment of a heat treatment apparatus of the present invention.
Figure 2:
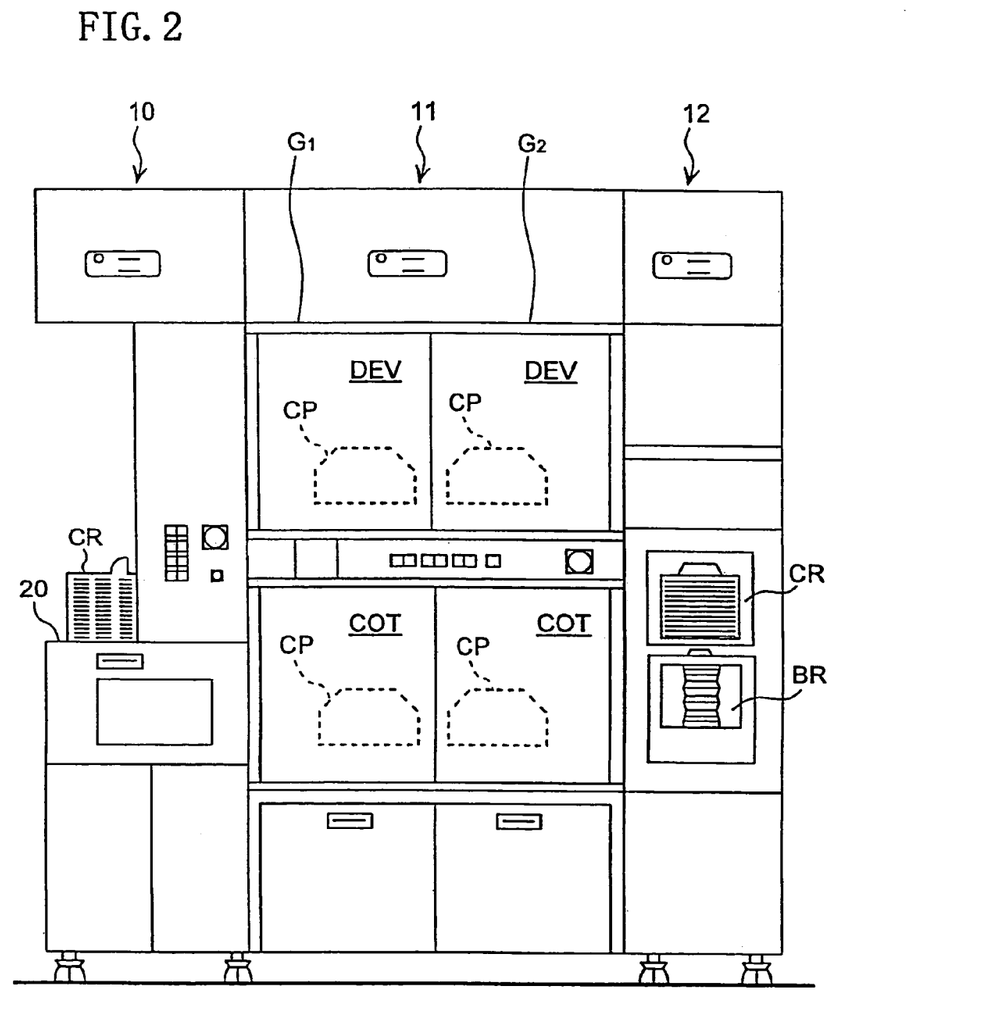
FIG. 2 is a schematic front view of the resist coating/development processing system shown in FIG. 1.
Figure 3:
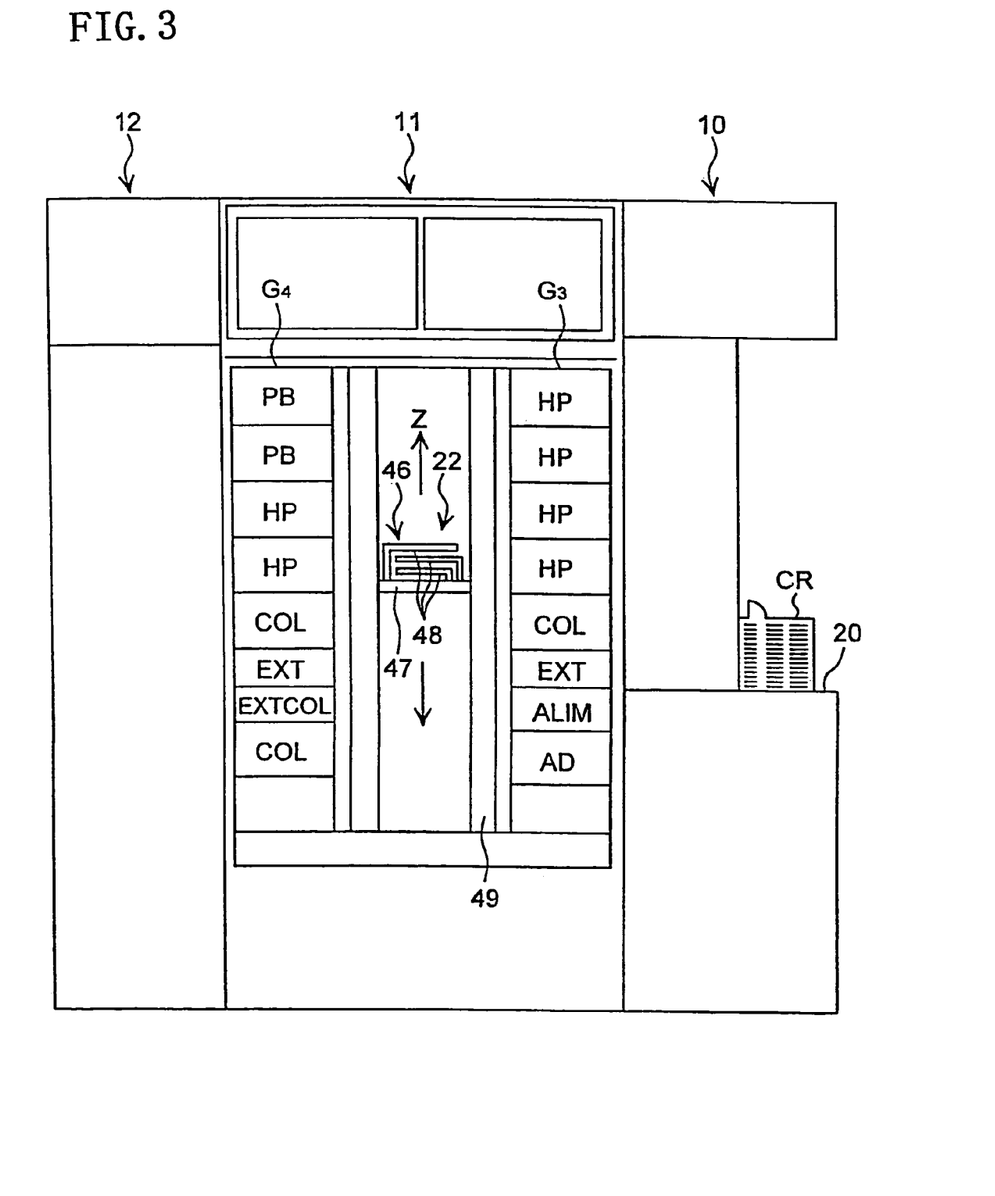
FIG. 3 is a schematic rear view of the resist coating/development processing system shown in FIG. 1.

A resist coating/development processing system 1 as an embodiment of the present invention has, as shown in FIGS. 1 to 3, a cassette station 10 as a carrier station, a processing station 11 having a plurality of processing units, and an interface unit 12 for passing/receiving a wafer W to/from a not-shown exposure apparatus provided adjacent to processing station 11.

Cassette station 10 is provided to carry wafers W between a wafer cassette CR and processing station 11, for example, to carry a plurality of wafers W as bodies to be processed, for example, 25 wafers W as a unit in a state where they are mounted on wafer cassette CR from another system to resist coating/development processing system 1 or to carry wafers W from resist coating/development processing system 1 to another system.

In cassette station 10, as shown in FIG. 1, a plurality of (four in the figure) positioning projections 20a are formed along the X direction in the figure on a cassette mounting table 20. In the positions of projections 20a, wafer cassettes CR can be disposed in a line so that a wafer outlet/inlet of each of wafer cassettes CR faces processing station 11. In wafer cassette CR, wafers W are arranged in the vertical direction (Z direction). Cassette station 10 has a wafer carrying mechanism 21 positioned between cassette mounting table 20 and processing station 11.

Wafer carrying mechanism 21 has an arm 21a for carrying wafers which is movable in the cassette arrangement direction (X direction) and the arrangement direction (Z direction) of wafers W in each cassette, and can selectively access any of wafer cassettes CR by arm 21a for carrying wafers. Arm 21a for carrying wafers is constructed to be turnable in the θ direction shown in FIG. 1 and can also access an alignment unit (ALIM) and an extension unit (EXT) belonging to a third processing unit $G_3$ on processing station 11 side which will be described later.

Processing station 11 has a plurality of processing units for performing a series of processes for coating and developing wafers W. The plurality of processing units are arranged in predetermined positions in a number of stages and process wafers W one by one. Processing station 11 has, as shown in FIG. 1, a wafer carrying path 22a in its center portion. In wafer carrying path 22a, a main wafer carrying mechanism 22 is provided. All of the processing units are disposed around wafer carrying path 22a. The plurality of processing units are divided into a plurality of processing groups. In each processing group, a plurality of processing units are arranged in a number of stages along the vertical direction (Z direction).

Main wafer carrying mechanism 22 has, as shown in FIG. 3, a wafer carrying apparatus 46 so as to be movable in the vertical direction (Z direction) on the inside of a cylindrical supporting member 49. Cylindrical supporting member 49 can be rotated by a rotation driving force of a not-shown motor and, in association with the rotation, wafer carrying apparatus 46 can also integrally rotate. Wafer carrying apparatus 46 has a plurality of holding arms 48 which are movable in the longitudinal direction of a carriage base 47 and realizes transfer of wafers W to/from the processing units by holding arms 48.

As shown in FIG. 1, in resist coating/development processing system 1, five processing groups $G_1$, $G_2$, $G_3$, $G_4$ and $G_5$ are actually disposed around wafer carrying path 22a. Among them, first and second processing groups $G_1$ and $G_2$ are disposed in parallel on the front face side of resist coating/development processing system 1 (front side in FIG. 1), third processing group $G_3$ is disposed adjacent to cassette station 10, fourth processing group $G_4$ is disposed adjacent to interface unit 12, and fifth processing group $G_5$ is disposed on the rear face side.

In first processing group $G_1$, as shown in FIG. 2, a resist coating unit (COT) and a developing unit (DEV) for developing a resist pattern as two spinner-type processing units for mounting wafer W on a not-shown spin chuck and performing a predetermined process in a coater cup (CP) are stacked in this order in two stages. In second processing group $G_2$, similarly, resist coating unit (COT) and a developing unit (DEV) as two spinner-type processing units are stacked in this order in two stages.

In third processing group $G_3$, as shown in FIG. 3, oven-type processing units for performing predetermined processes on wafer W mounted on a mounting table SP are stacked in multiple stages. Specifically, an adhesion unit (AD) for performing so-called a hydrophobic property giving process for enhancing fixation of a resist, alignment unit (ALIM) for performing alignment, extension unit (EXT) for carrying wafer W in and out, a cooling unit (COL) for performing a cooling process, and four hot plate units (HP) for performing a heating process on wafer W before/after an exposing process and, further, after a developing process are sequentially stacked in eight stages. It is also possible to provide a cooling unit (COL) in place of alignment unit (ALIM) and give the alignment function to the cooling unit (COL).

Also in fourth processing group $G_4$, oven-type processing units are stacked in multiple stages. Specifically, cooling unit (COL), an extension cooling unit (EXTCOL) as a wafer carrying in/out unit having a cooling plate, extension unit (EXT), cooling unit (COL), two hot plate units (HP), and two pre-bake units (PB) dedicated to a process of pre-baking wafer W on which a resist solution is applied are sequentially stacked in this order in eight stages.

In the case of providing fifth processing group $G_5$ on the rear side of main wafer carrying mechanism 22, as shown in FIG. 2, fifth processing group $G_5$ can be moved to a side along guide rails 25 when seen from main wafer carrying mechanism 22. Therefore, even in the case of providing fifth processing group $G_5$, by sliding fifth processing group $G_5$ along guide rails 25, a space is assured. Consequently, maintenance work can be easily made on main wafer carrying mechanism 22 from the rear side.

Interface unit 12 has the same length as that of processing station 11 in the depth direction (X direction). As shown in FIGS. 1 and 2, in the front face portion of interface unit 12, a portable pickup cassette CR and a fixed buffer cassette BR are stacked in two stages. In the rear face portion, a peripheral exposing apparatus 23 is disposed. A wafer carrying mechanism 24 is disposed in a center portion. Wafer carrying mechanism 24 has an arm 24a for carrying wafers. Arm 24a for carrying wafers can move in the X and Z directions and access both cassettes CR and BR and peripheral exposing apparatus 23.

Arm 24a for carrying wafers can turn in the θ direction and can access also extension unit (EXT) belonging to fourth processing group $G_4$ of processing station 11 and, further, a not-shown wafer transfer table on the side of a neighboring exposing apparatus.

According to resist coating/development processing system 1, first, in cassette station 10, arm 21a for carrying wafers of wafer carrying mechanism 21 accesses wafer cassette CR housing unprocessed wafers W on cassette mounting table 20, takes one wafer W, and carries it to extension unit (EXT) of third processing group $G_3$.

Wafer W is carried from extension unit (EXT) into processing station 11 by wafer carrying apparatus 46 of main wafer carrying mechanism 22. Wafer W is aligned by alignment unit (ALIM) in third processing unit $G_3$ and, after that, carried to adhesion processing unit (AD) where the hydrophobic property giving process (HMDS process) for enhancing fixation of a resist is performed. Since the process accompanies heating, wafer W is carried by wafer carrying apparatus 46 to cooling unit (COL) and cooled.

Wafer W processed by adhesion processing unit (AD) and cooled by cooling unit (COL) or wafer W which is not processed by adhesion processing unit (AD) is continuously carried by wafer carrying apparatus 46 to resist coating unit (COL) where wafer W is coated with a resist and a coating film is formed. After completion of the coating process, wafer W is pre-baked in pre-bake unit (PB) in fourth processing group $G_4$ and cooled in any of cooling units (COL). A processing mode of wafer W in pre-bake unit (PB) will be described in detail later.

Cooled wafer W is carried to alignment unit (ALIM) of third processing group $G_3$ where it is aligned. After that, wafer W is carried to interface unit 12 via extension unit (EXT) of fourth processing group $G_4$.

Wafer W is subjected to peripheral exposure by peripheral exposing apparatus 23 in interface unit 12, thereby removing an excessive resist. After that, wafer W is carried to a not-shown exposing apparatus provided adjacent to interface unit 12 and the resist film of wafer W is subjected to the exposing process in accordance with a predetermined pattern.

Exposed wafer W is returned to interface unit 12 and is carried to extension unit (EXT) belonging to fourth processing group $G_4$ by wafer carrying mechanism 24. Wafer W is carried to any of hot plate units (HP) by wafer carrying apparatus 46, subjected to a post exposure and bake process and, after that, cooled by cooling unit (COL).

Subsequently, wafer W is carried to developing unit (DEV) where the exposure pattern is developed. After completion of development, wafer W is carried to any of hot plate units (HP), subjected to a post bake process and, after that, cooled by cooling unit (COL). After such a series of processes is finished, wafer W is returned to cassette station 10 via extension unit (EXT) of third processing group $G_3$ and housed in any of wafer cassettes CR.

Figure 4:
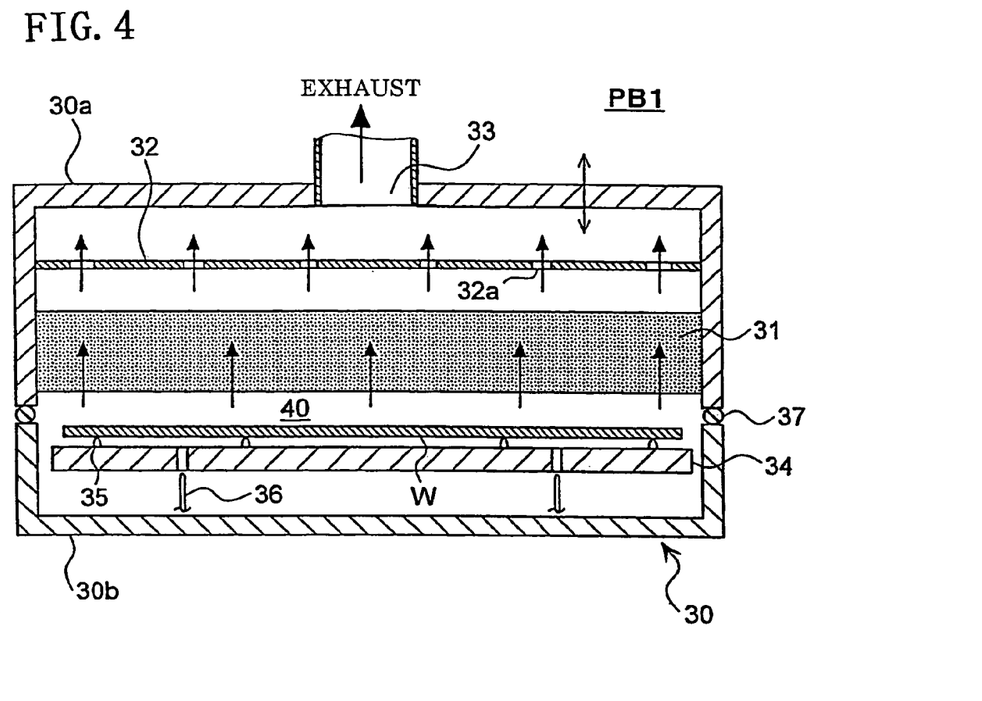
FIG. 4 is a schematic sectional view showing an embodiment of a pre-bake unit applied to the resist coating/development processing system shown in FIGS. 1 to 3.

An embodiment of the pre-bake unit of the present invention will now be described in detail. FIG. 4 is a sectional view showing a pre-bake unit PB1 as an embodiment of the present invention. Pre-bake unit PB1 has a mounting plate 34 on which wafer W is mounted, a chamber 30 constructed by an upper vessel 30a and a lower vessel 30b, and lift pins 36 for lifting wafer W. Upper vessel 30a is provided with a hot plate 31 made of porous material for heating a resist film formed on wafer W, and an exhaust adjusting plate 32 for adjusting flow of gas exhausted so that gas is uniformly exhausted from hot plate 31.

Lower vessel 30b is fixed and mounting plate 34 is fixed to lower vessel 30b. Upper vessel 30a can be lifted by a not-shown lifting mechanism. In a state where upper vessel 30a descends, upper vessel 30a and lower vessel 30b are closely attached to each other via a seal member 37, thereby forming a processing chamber 40. When processing chamber 40 is formed in a state where wafer W is mounted on mounting plate 34, hot plate 31 is disposed at a predetermined height level from the surface of wafer W. In such a manner, the resist film can be directly heated by hot plate 31.

Hot plate 31 is made of, for example, porous ceramics including a heater and has gas permeability. In the center of the top face of upper vessel 30a, an exhaust port 33 is provided. When an operation of exhausting air from exhaust port 33 is performed, pressure in upper vessel 30a is reduced. Further, since hot plate 31 has gas permeability, pressure in processing chamber 40 is also reduced. Exhaust adjusting plate 32 plays the role of suppressing easy exhaust of much gas from the center portion of hot plate 31 due to the fact that exhaust port 33 is provided in the center portion of the top face of upper vessel 30a.

Figure 6A:
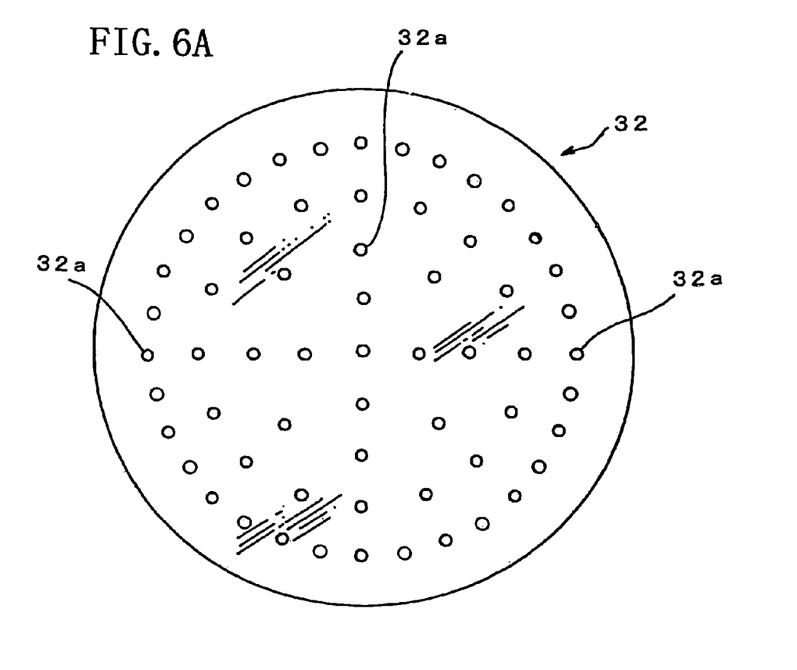
FIGS. 6A and 6B are sectional views showing two modes of arrangement of holes 32a of an exhaust adjusting plate 32.
Figure 6B:
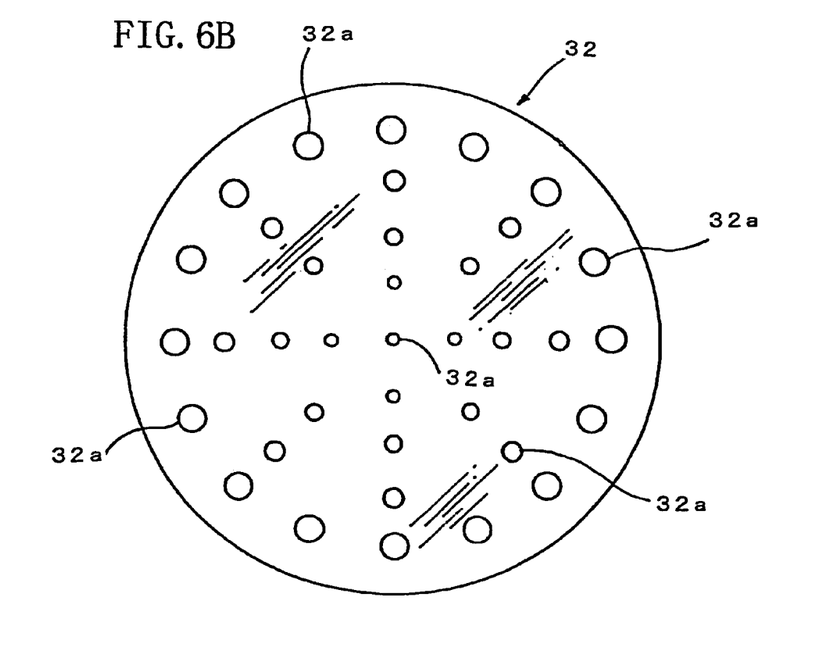

For example, a plurality of holes 32a is provided in exhaust adjusting plate 32. As shown in FIG. 6A, for example, by forming a small number of holes 32a in the center portion of exhaust adjusting plate 32 and forming a large number of holes 32a in the peripheral portion, gas transmits hot plate 31 uniformly. For example, as shown in FIG. 6B, by making the diameter of hole 32a shorter in the center portion and making the diameter of hole 32a longer in the peripheral portion, a similar effect can be obtained.

Lift pins 36 can be lifted by a not-shown lifting mechanism. In mounting plate 34, holes from which lift pins 36 can project are formed. In a state where upper vessel 30a is lifted and the top face of lower vessel 30b is open, lift pins 36 pass/receive wafer W to/from holding arm 48.

In pre-bake unit PB1 having such a configuration, first, in a state where upper vessel 30a is allowed to escape to the upper and the top face of lower vessel 30b is open, holding arm 48 holding wafer W is allowed to enter above mounting plate 34. Next, when lift pins 36 are lifted, wafer W is passed from holding arm 48 to lift pins 36. After wafer W leaves holding arm 48, holding arm 48 is receded and, subsequently, lift pins 36 are lowered. Wafer W is held by proximity pins 35 provided on the surface of mounting plate 34 and passed from lift pins 36 to mounting plate 34.

After that, upper vessel 30a is lowered to form processing chamber 40. Hot plate 31 is disposed at a predetermined height level from the surface of wafer W and the resist film is directly heated by hot plate 31. Conventionally, as shown in FIG. 10, wafer W is placed on hot plate 103 and, by heating wafer W, the resist film formed on wafer W is heated. It causes a problem that a temperature distribution of wafer W is transferred to the resist film and CD uniformity deteriorates. In contrast, in pre-bake unit PB1, the resist film is directly heated, so that temperature uniformity of the resist film is increased and CD uniformity can be increased.

On start of heating of the resist film by hot plate 31, an operation of exhausting air from exhaust port 33 is started. When exhaust from exhaust port 33 starts, the pressure on the inside of upper vessel 30a is reduced and, further, since hot plate 31 itself has gas permeability, the pressure in processing chamber 40 is also reduced. On the other hand, a solvent is evaporated or sublimated from the resist film heated by hot plate 31 and gas is generated. Consequently, when processing chamber 40 is in a pressure-reduced atmosphere, the gas evaporated from the resist film pass through hot plate 31 and is exhausted from export port 33.

In a state where gas can pass through entire hot plate 31 almost uniformly, gas evaporated from the resist film does not generate a large air current in the horizontal direction in processing chamber 40 but generates an air current which is almost upright from the resist film. It can suppress a change in resist film thickness caused by generation of air current and, moreover, uniform evaporation of gas from the resist film can be achieved, so that the quality of the resist film can be made uniform. Thus, CD uniformity is improved and smoothing of a pattern side face can be promoted.

By exhausting gas from exhaust port 33, processing chamber 40 is held in pressure reduced atmosphere. The degree of pressure reduction is preferably low to a degree that gas is generated from the resist film mainly by heating of the resist film but not mainly by drop in evaporation pressure when the pressure in processing chamber 40 is reduced. It is also preferable to exhaust gas from exhaust port 33 gently from start of the exhaust for the following reason. If gas is strongly exhausted from exhaust port 33 and processing chamber 40 is held in highly-pressure-reduced atmosphere, there is a possibility in that a distribution occurs in the resist film thickness due to disturbance of air current at an initial stage of exhaust.

In order to prevent gas, for example, a sublimate evaporated from the resist film and exhausted from exhaust port 33 from being cooled, solidified, and adhered in a pipe, a mechanism for cooling and solidifying a sublimate may be provided in the vicinity of exhaust port 33.

After completion of a process of predetermined time on wafer W, the operation of exhausting gas from exhaust port 33 is stopped, upper vessel 30a is lifted, and wafer W is carried out from pre-bake unit PB1 by a procedure reverse to the procedure of carrying wafer W from holding arm 48 into pre-bake unit PB1. Wafer W is then carried via alignment unit (ALIM) and the like to the exposing apparatus.

Figure 5:
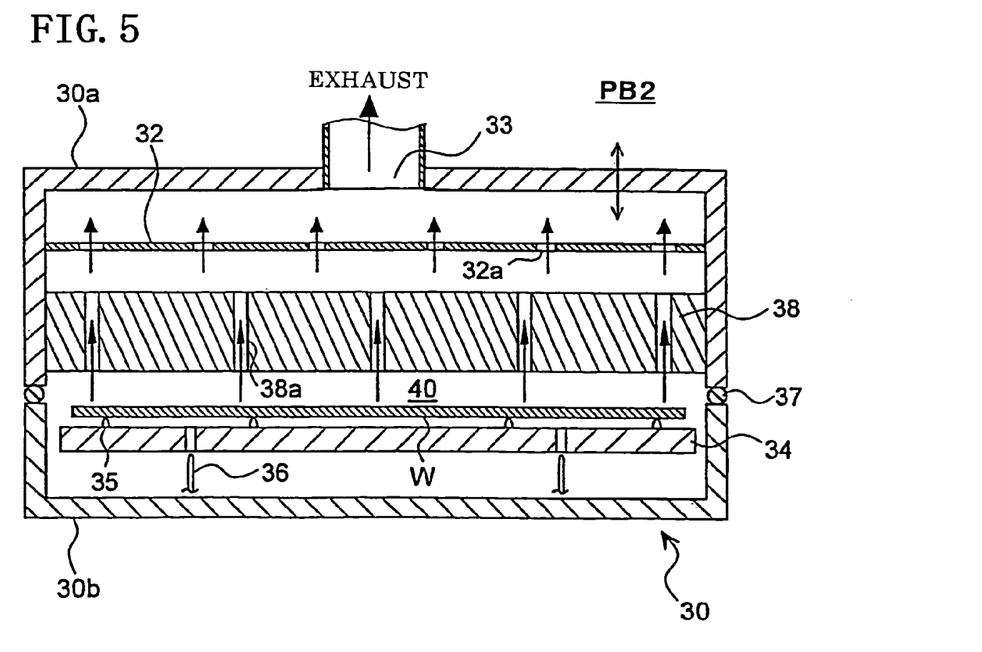
FIG. 5 is a schematic sectional view showing another embodiment of the pre-bake unit.

Another embodiment of the pre-bake unit of the present invention will now be described. FIG. 5 is a schematic sectional view of a pre-bake unit PB2 of another embodiment. The different point of pre-bake unit PB2 from pre-bake unit PB1 shown in FIG. 4 is only the structure of a hot plate 38. Hot plate 38 will be described below. In hot plate 38, a plurality of through holes 38a are formed so as to penetrate hot plate 38 in the vertical direction and serve as paths of gas evaporated from the resist film.

In the case where exhaust adjusting plate 32 is provided, through holes 38a can be provided, for example, at equal intervals since the amount of gas passing through each of through holes 38a is adjusted by exhaust adjusting plate 32. On the other hand, by forming a small number of through holes 38a in the center portion of hot plate 38 and forming a large number of through holes 38a in the peripheral portion, gas can be uniformly passed from processing chamber 40 to exhaust port 33 by whole hot plate 38 without providing exhaust adjusting plate 32.

Figure 7A:
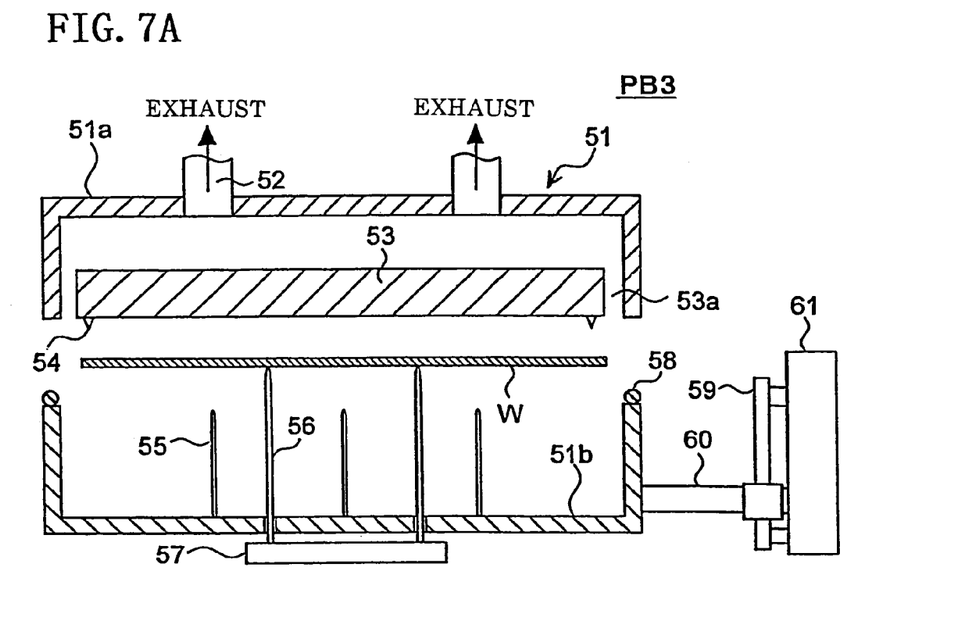
FIGS. 7A and 7B are schematic sectional views showing still another embodiment of the pre-bake unit.
Figure 7B:
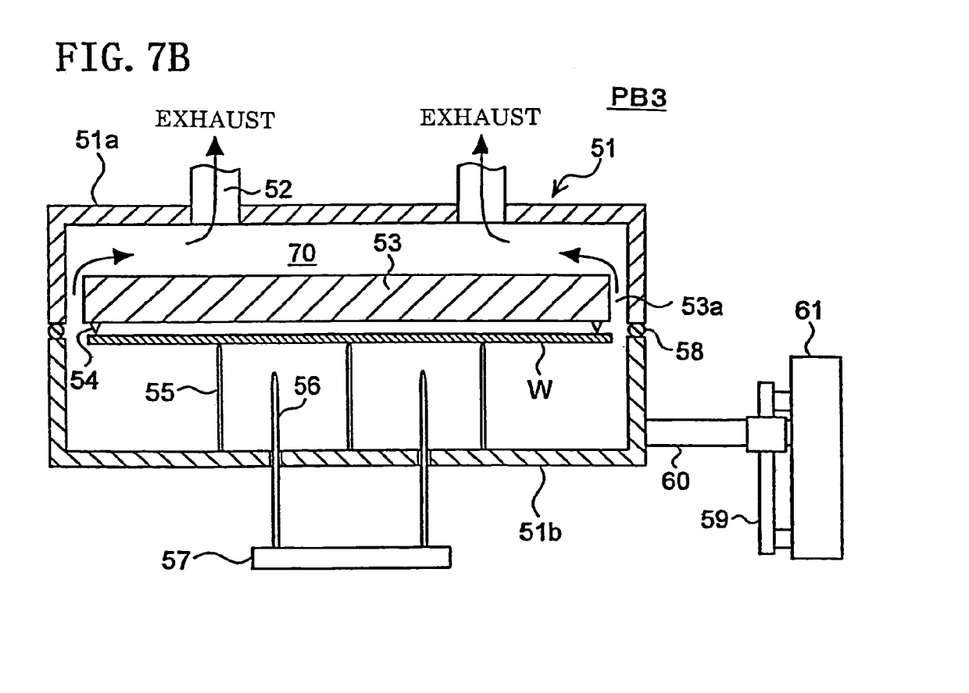

FIGS. 7A and 7B are schematic sectional views showing still another embodiment of the pre-bake unit (referred to as "pre-bake unit PB3"). FIG. 7A shows a state where wafer W is carried in/out in pre-bake unit PB3, and FIG. 7B shows a state where the resist film is heated. Pre-bake unit PB3 has: a chamber 51 constructed by a fixed upper vessel 51a and a lower vessel 51b which can be lifted; a hot plate 53 fixed to upper vessel 51a; supporting pins 55 fixed to lower vessel 51b; and wafer transfer pins 56 fixed to a holding table 57 so as to penetrate the bottom wall of lower vessel 51b.

Lower vessel 51b is coupled to a holding member 60. Holding member 60 engages with a guide 59 extending in the vertical direction and is attached to a lifting apparatus 61 having therein an air cylinder and the like. As shown in FIG. 7A, in a state where lower vessel 51a is lowered and held, holding arm 48 (not shown in FIGS. 7A and 7B) which holds wafer W is allowed to enter chamber 51, and wafer W can be passed to wafer transfer pins 56 projected from lower vessel 51b. With such a configuration, it is sufficient to provide only lifting apparatus 61 for lifting lower vessel 51b as a power source, so that power sources of wafer transfer pins 56 and supporting pins 55 can be made unnecessary.

As shown in FIG. 7B, when lifting apparatus 61 is operated to lift lower vessel 51b, lower vessel 51b and upper vessel 51a are closely attached to each other via a seal member 58 to thereby form a processing chamber 70. During lifting of lower vessel 51b, wafer W held by wafer transfer pins 56 is passed to supporting pins 55 and is held so as to be apart from hot plate 53 with a predetermined distance. It is preferable to provide proximity pins 54 on the under face of hot plate 53 in order to make the distance between hot plate 53 and wafer W constant and to hold lower vessel 51b in a position where wafer W comes into contact with proximity pins 54. In this case, it is preferable to use seal member 58 having a width in a deformable length range. In order to lessen a shock to wafer W when wafer W comes into contact with proximity pins 54, a retractable mechanism, for example, a spring may be provided under each of supporting pins 55.

An exhaust port 52 is provided in an upper wall of upper vessel 51a and can exhaust gas in processing chamber 70. Between hot plate 53 and an inner face of a side wall of upper vessel 51a, a gap 53a is formed. Gas evaporated from the resist film which is directly heated by hot plate 53 passes from the gap between hot plate 53 and wafer W and gap 53a and is exhausted from exhaust port 52.

In a manner similar to pre-bake unit PB1 described with reference to FIG. 4, the strength of exhaust from exhaust port 52 is set to a degree that gas evaporated by heating the resist film is exhausted. Consequently, by suppressing occurrence of a strong air current in the horizontal direction in the space between hot plate 53 and wafer W, non-uniformity in thickness of the resist film can be prevented, and the quality of the resist film can be made uniform.

Modifications of the embodiments described with reference to FIG. 4 and FIGS. 7A and 7B will now be described with reference to FIGS. 8A and 8B.

Figure 8A:
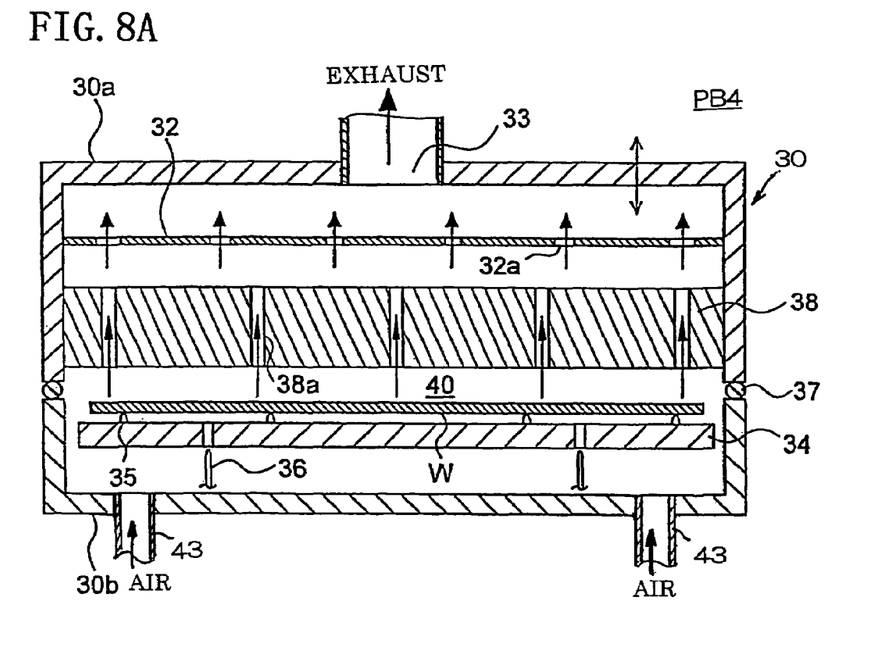
FIGS. 8A and 8B are sectional views showing a modification of the pre-bake unit shown in FIG. 4 and FIGS. 7A and 7B.
Figure 8B:
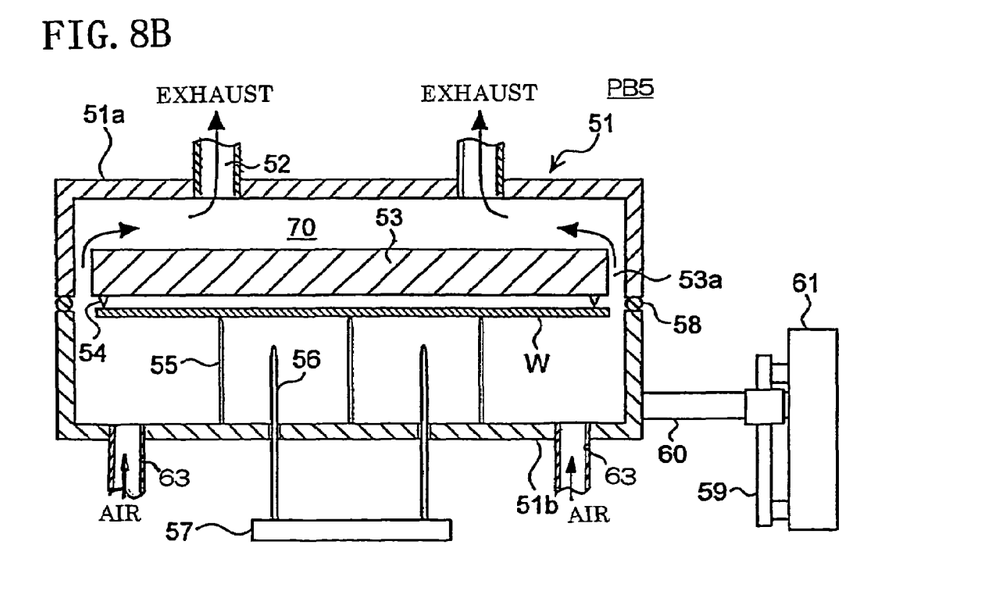

Pre-bake units PB4 and PB5 shown in FIGS. 8A and 8B, respectively, are different from pre-bake unit PB1 shown in FIG. 4 in the point that air supply pipes 43 and 63 are disposed in the vicinity of both right and left ends of the bottom of lower vessel 51b. Air supply pipes 43 and 63 are disposed for the reason that, in some cases, it is necessary to supply air to prevent wafer W from becoming hard to be heated due to excessive pressure reduction in chambers 30 and 51.

By making steam of a solvent of the resist at an almost saturated vapor pressure be included in the air supplied from air supply pipes 43 and 63, the following effects are obtained.

In the process of pre-baking the wafer on which the resist film is formed, when evaporation of the solvent of the resist progresses rapidly, due to a change by heat of the resist film, non-uniformity of the film quality such as variations in film quality tends to occur in the main surface of the wafer. On the other hand, when steam of the solvent of the resist is included at an almost saturated vapor pressure in the chamber, evaporation of the solvent from the resist film in the pre-bake process is suppressed, and evaporation progresses at lower speed. As a result, uniformity of the quality of the resist film can be further improved.

A pre-bake unit PB6 as yet another embodiment of the present invention will now be described with reference to FIGS. 9A and 9B.

Figure 9A:
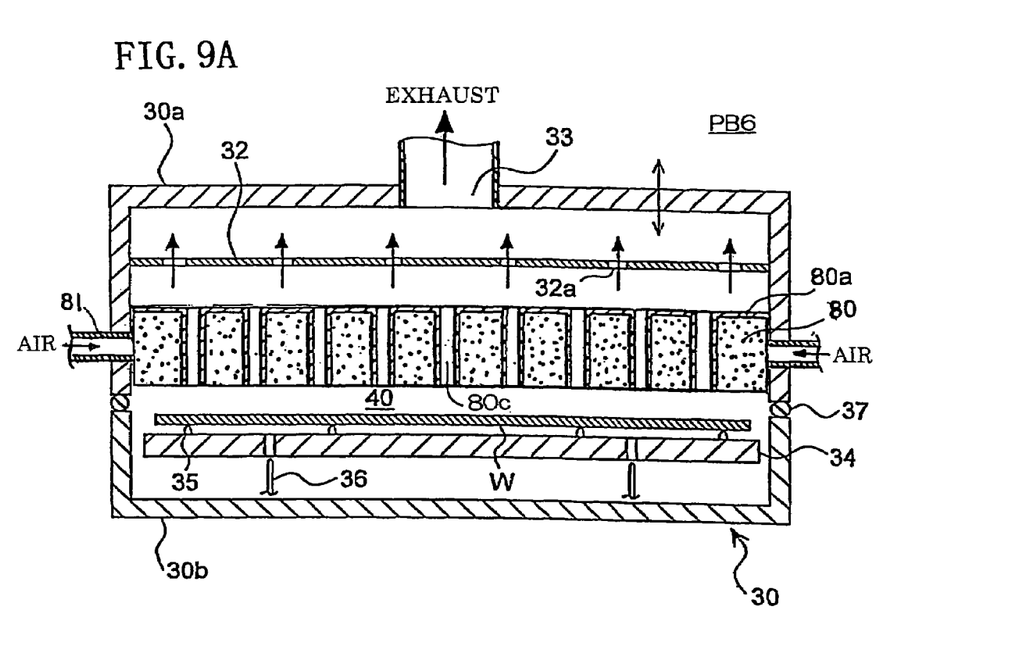
FIGS. 9A and 9B are schematic sectional views showing yet another embodiment of the pre-bake unit.

Pre-bake unit PB6 shown in FIG. 9A is different from pre-bake unit PB 1 shown in FIG. 4 in the points that, in place of hot plate 31 in FIG. 4, a hot plate 80 made of a porous material such as porous ceramics and having a plurality of vertical holes 80c penetrating hot plate 80 in the vertical direction is provided, and an air supply pipe 81 for supplying air to wafer W in chamber 30 via hot plate 80 is disposed in a side portion of upper vessel 30a.

Hot plate 80 is formed in a disc shape, and linear vertical holes 80c are formed in parallel with the axial line of hot plate 80 (axial line connecting the top face and the under face). A plurality of vertical holes 80c are formed in the radial and circumferential directions of hot plate 80.

A gas barrier layer 80d formed on the top face of hot plate 80 and the inner wall of each of vertical holes 80c is made of fluororesin which is heat-resisting and stainproof resin, for example, Teflon (Trademark) and has a thickness of 10 µm or more.

By gas barrier layer 80d, two gas flow paths are formed in hot plate 80. Specifically, two gas flow paths of a communication hole for supply and a vertical hole for exhaust are formed. Since gas barrier layer 80d is made of fluororesin, excellent gas barrier performance can be assured and wafers and the like are not contaminated.

First, before a wafer process is started, supply of air from supply pipe 81 is started and, simultaneously, exhaust from exhaust port 33 is started. It starts purging in chamber 30. Heating of wafer W is started by hot plate 80, and wafer W is heated at a predetermined heating temperature for predetermined time.

At this time, air supplied from air supply pipe 81 is introduced from a side wall of hot plate 80, flows in the communication hole formed in hot plate 80 toward a center portion of wafer W, and is discharged from the under face of hot plate 80. Since gas barrier layer 80d is formed, the air flowing in the communication hole is not leaked from the top face of hot plate 80 and the inner wall of vertical hole 80c.

The air discharged from the under face of hot plate 80 is supplied to a process surface of wafer W. On the other hand, exhaust flows through vertical hole 80c, exhaust adjusting plate 32 and exhaust port 33 and is ejected to the outside.

As described above, for the surface to be processed of wafer W, air can be substituted on a small area unit basis and the solvent in the resist in each area can be uniformly evaporated. Consequently, by controlling the air current at the time of drying, uniform resist film thickness can be obtained.

Also in the embodiment, by vaporizing the solvent in the resist solution and including the steam in the air supplied from air supply pipe 81 at an almost saturated vapor pressure, an effect of improvement in uniformity of the quality of the resist film can be enhanced by the action as described above.

In the above embodiment, air is introduced from air supply pipe 81 into a side wall of hot plate 80 and exhausted from vertical holes 80c. As shown in FIG. 9C, air may be introduced from the top face side of hot plate 80 via an air supply port 39 provided in the upper portion of upper vessel 30a. In this case, the air passed through vertical holes 80c enters hot plate 80 from the under face of hot plate 80 and is exhausted from an exhaust pipe 82 provided on a side wall of upper vessel 30a.

Figure 9B:
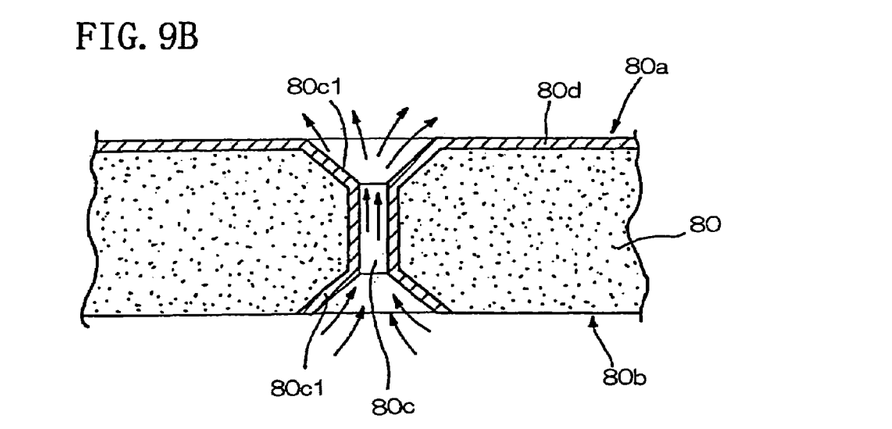
Figure 9C:
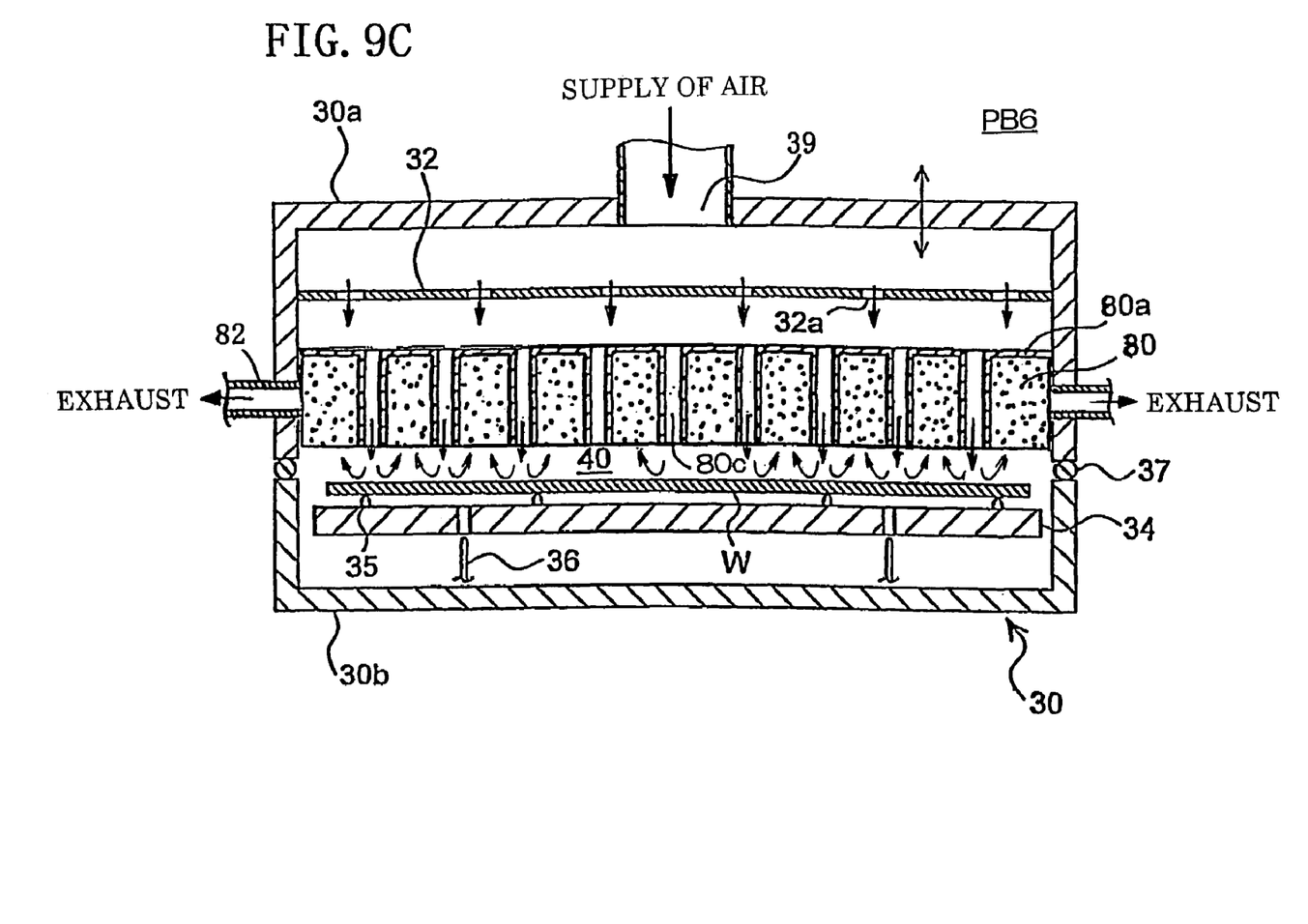
FIG. 9C is a schematic sectional view showing a modification thereof.

Although linear holes are shown as vertical holes 80c in the above embodiments, as shown in FIG. 9B, preferably, the diameter of an opening provided in each of a top face 80a and an under face 80b of hot plate 80 is larger than that of vertical hole 80c, and a taper face 80c1 is formed between the opening and vertical hole 80c.

By formation of the taper face, air can be supplied and exhausted smoothly.

Although the embodiments of the present invention have been described above, the present invention is not limited to the above embodiments. For example, in pre-bake unit PB3 shown in FIGS. 7A and 7B, without providing gap 53a, in place of hot plate 53, hot plate 31 made of a porous material having gas permeability shown in FIG. 4 or hot plate 38 in which through holes 38a are formed shown in FIG. 5 can be used.

In the case of using the hot plate made of a porous material when the exhaust port is formed in the center of the top face of the upper vessel of the chamber, by using a hot plate in which porosity of the center portion is lower than that of the peripheral portion, that is, gas penetrability in the center portion is lower than that in the peripheral portion, gas can be transmitted uniformly in the whole hot plate without providing exhaust adjusting plate 32. In pre-bake units PB1 and PB2 shown in FIGS. 4 and 5, wafer W is held on mounting plate 34. As in pre-bake unit PB3 shown in FIGS. 7A and 7B, wafer W may be held by supporting pins 55.

Further, in the above embodiments, the case of applying the heat treatment apparatus and the heat treatment method of the present invention to pre-bake units for pre-baking a resist film has been described. The present invention can be also applied to a hot plate unit (HP) for performing a post-exposure baking process after an exposing process and a post-baking process after a developing process. The kind of a coating film is not limited to the resist film. The present invention can be applied to an apparatus and method for forming an interlayer insulating film and a protection film. Although a semiconductor wafer has been described as a substrate in the above embodiments, the heat treatment apparatus and the heat treatment method of the present invention can be also applied to a photolithography process on other substrates such as a liquid crystal display (LCD) substrate.

INDUSTRIAL APPLICABILITY

As described above, according to the present invention, it is possible to directly heat a coating film formed on a wafer from above, make gas or the like included in the coating film uniformly evaporate from the coated film, and exhaust the gas. As compared with a method of indirectly heating a coating film by heating a wafer, transfer of temperature non-uniformity of the wafer to the coating film is suppressed. Consequently, conspicuous effects that uniformity of the quality of the coating film can be improved and CD uniformity can be improved are obtained. By increasing uniformity of the quality of the coating film, effects such that LER characteristics are changed for the better and a smooth pattern side face can be obtained are also produced.

What is claimed is:

1. A heat treatment apparatus for performing heat treatment on a wafer having a surface on which a coating film is formed, comprising:
   a chamber for housing the wafer, including a fixed upper vessel and a vertically movable lower vessel;
   a supporting pin fixed to said lower vessel and holding said wafer substantially horizontally;
   a hot plate disposed above the wafer held by said supporting pin in said chamber so that the coating film formed on said wafer can be directly heated;
   an exhaust port provided in said upper vessel of said chamber and exhausting gas in said chamber, and
   a wafer transferring member configured to support said wafer and provided to penetrate a bottom wall of said lower vessel so as to pass the supported wafer to said supporting pin when said lower vessel is lifted and so as to receive the wafer from said supporting pin when said lower vessel is lowered; wherein
   a gap having a predetermined width is provided between an end face of said hot plate and an inner wall face of said chamber,
   the gas in said chamber is exhausted from said exhaust port, thereby holding the inside of said chamber in a predetermined pressure-reduced atmosphere, and
   gas generated from said coating film when said coating film is heated by said hot plate passes through said gap and is exhausted to the outside of said chamber.

2. The heat treatment apparatus according to claim 1, wherein
   said coating film is a resist film formed by coating a resist solution on the wafer.

3. The heat treatment apparatus according to claim 1, further comprising:
   means for supplying air into said chamber.

4. The heat treatment apparatus according to claim 3, wherein said coating film is a resist film formed by coating the wafer with a resist solution, and the means for supplying air into said chamber has means for making steam of a solvent of the resist to be included in the air at an almost saturated vapor pressure.

5. A heat treatment apparatus for performing heat treatment on a wafer having a surface on which a coating film is formed, comprising:
   a holding member for holding said wafer substantially horizontally;
   a chamber for housing the wafer held by said holding member;
   a hot plate having gas permeability and disposed above the wafer held by said holding member in said chamber so that the coating film formed on said wafer can be directly heated; and
   an exhaust port provided on the top face of said chamber and exhausting gas in said chamber, wherein
   gas generated from said coating film when said coating film is heated by said hot plate passes through said hot plate and is exhausted to the outside of said chamber.

6. The heat treatment apparatus according to claim 5, wherein
   said coating film is a resist film formed by coating a resist solution on the wafer.

7. The heat treatment apparatus according to claim 5, wherein
   a plurality of through holes penetrating said hot plate in the vertical direction is provided in said hot plate.

8. The heat treatment apparatus according to claim 5, wherein
   said hot plate is made of a porous material having permeability.

9. The heat treatment apparatus according to claim 5, wherein
   an exhaust adjusting plate in which holes are provided in predetermined positions is provided between said hot plate and the top face of said chamber so that said gas uniformly passes through the whole surface of said hot plate.

10. The heat treatment apparatus according to claim 5, wherein said chamber has a fixed upper vessel and a vertically-movable lower vessel,
    said holding member is fixed to said lower vessel and said exhaust port is provided in said upper vessel, and
    the apparatus further comprises a wafer transferring member configured to support said wafer and is provided to penetrate a bottom wall of said lower vessel so as to pass the supported wafer to said holding member when said lower vessel is lifted and so as to receive the wafer from said holding member when said lower vessel is lowered.

11. The heat treatment apparatus according to claim 5, further comprising:

means for supplying air into said chamber.

12. The heat treatment apparatus according to claim 11, wherein said coating film is a resist film formed by coating the wafer with a resist solution, and the means for supplying air into said chamber has means for making steam of a solvent of the resist to be included in the air at an almost saturated vapor pressure.

13. A heat treatment method comprising:

a first step of forming a resist film by coating a wafer with a resist solution;

a second step of holding said wafer on which the resist film is formed in a hermetically closed chamber; and a third step of disposing a hot plate having gas permeability in a predetermined position above said wafer on which the resist film is formed and, while heating said resist film by the hot plate, exhausting gas in said chamber so that gas evaporated from said resist film is exhausted by passing through said hot plate.

14. The heat treatment method according to claim 13, further comprising:

a step of supplying air into said chamber.

15. The heat treatment method according to claim 13, further comprising:

a step of supplying air including steam of a solvent of a resist at an almost saturated vapor pressure into said chamber.

16. A heat treatment method comprising:

a first step of forming a resist film by coating a wafer with a resist solution;

a second step of placing said wafer on which the resist film is formed on a wafer transferring member provided to penetrate a bottom wall of a vertically movable lower vessel in a chamber including a fixed upper vessel and said lower vessel and passing the wafer to a supporting pin provided in said lower vessel by lifting said lower vessel;

a third step of supporting said wafer with said supporting pin after said second step, while heating said resist film, with said chamber being sealed, by a hot plate disposed in a predetermined position above said wafer on which said resist film is formed, exhausting gas in said chamber through an exhaust port provided in said upper vessel to hold said chamber in a predetermined pressure-reduced atmosphere, and exhausting gas evaporated from said resist film from said chamber through a gap having a predetermined width provided between an end face of said hot plate and an inner wall face of said chamber; and a fourth step of passing said wafer from said supporting pin to said transferring member by lowering said lower vessel.

17. The heat treatment method according to claim 16, further comprising:

a step of supplying air into said chamber.

18. The heat treatment method according to claim 16, further comprising:

a step of supplying air including steam of a solvent of a resist at an almost saturated vapor pressure into said chamber.

19. The heat treatment apparatus according to claim 1, further comprising a proximity pin for making a distance between said hot plate and said wafer constant and provided on an under face of said hot plate.

20. The heat treatment method according to claim 16, wherein said third step is performed in such a state that a distance between said hot plate and said wafer is maintained constant by a proximity pin provided on an under face of said hot plate.

* * * * *